(12) United States Patent
Wu et al.

(10) Patent No.: US 6,277,729 B1
(45) Date of Patent: *Aug. 21, 2001

(54) METHOD OF MANUFACTURING TRANSISTOR BARRIER LAYER

(75) Inventors: Bing-Chang Wu, Taipei; Cheng-Hui Chung, Hsinchu Hsien, both of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/042,855

(22) Filed: Mar. 17, 1998

(30) Foreign Application Priority Data

Dec. 5, 1997 (TW) .................................. 86118305

(51) Int. Cl.[7] ...................... H01L 21/4763; H01L 21/44
(52) U.S. Cl. ................ 438/627; 438/622; 438/629; 438/642; 438/648; 438/655; 438/656; 438/672; 438/675
(58) Field of Search .................... 438/643, 683, 438/622, 618, 625, 627, 629, 630, 637–640, 642–644, 648–651, 655–656, 658–660, 663–664, 672, 675, 685

(56) References Cited

U.S. PATENT DOCUMENTS

| | | | |
|---|---|---|---|
| 5,397,744 | * 3/1995 | Sumi et al. | ............................ 437/200 |
| 5,565,708 | * 10/1996 | Ohsaki et al. | ......................... 257/764 |
| 5,619,057 | * 4/1997 | Komatsu | ................................. 257/382 |
| 5,723,362 | * 3/1998 | Inoue et al. | ............................ 437/190 |
| 5,899,740 | * 5/1999 | Kwon | ..................................... 438/627 |
| 5,915,197 | * 6/1999 | Yamanaka et al. | .................. 438/586 |

FOREIGN PATENT DOCUMENTS

0720214 * 3/1996 (EP) .

\* cited by examiner

Primary Examiner—Charles Bowers
Assistant Examiner—Thanhha Pham

(57) ABSTRACT

A method for improving the fabrication of a transistor barrier layer that utilizes an ion bombardment treatment after the formation of the titanium nitride layer for reducing contact resistance and preventing tungsten plug stringer generation. The method comprises the step of patterning a transistor to form vias, and then depositing a titanium/titanium nitride layer over the transistor surface using a collimator sputtering method. Next, an ion bombardment treatment is carried out, and then a rapid thermal processing operation is performed. Finally, tungsten is deposited to fill the vias follow by a planarization. This invention is able to lower contact resistance because titanium in the titanium layer will not react with gaseous ammonia or nitrogen in the reacting chamber to form a high resistance titanium nitride layer during rapid thermal processing operation. In the meantime, no short-circuiting stringers leading from the tungsten plug to the titanium nitride layer below are formed because no cracks are formed in a titanium nitride layer that has been subjected to a stress reducing ion bombardment treatment.

13 Claims, 3 Drawing Sheets

METHOD OF MANUFACTURING TRANSISTOR BARRIER LAYER

CROSS-REFERENCE TO RELATED APPLICATION

This application claims the priority benefit of Taiwan application Ser. No.86118305, filed Dec. 5, 1997, the full disclosure of which is incorporated herein by reference.

BACKGROUND OF THE INVENTION

1. Field of Invention

The present invention relates to a transistor manufacturing process. More particularly, the present invention relates to a method for manufacturing a transistor barrier layer.

2. Description of Related Art

In the metallization of integrated circuits, low resistivity material such as aluminum or tungsten is quite often used in forming the conductive wires for forming links between devices. However, due to the formation of spikes at the contact interface between aluminum and silicon, contact resistance becomes very high. Hence, when either aluminum or tungsten is used to form metallic wiring, a conductive barrier layer is often formed at the contact interface. This not only will prevent the formation of spikes, but also can increase the adhesion of tungsten layer to other material. Commonly used material for forming barrier layer includes titanium nitride and tungsten nitride, but titanium nitride is more frequently used.

To increase the strength of ohmic contact of metal with silicon, the barrier layer is usually formed as a titanium/ titanium nitride composite layer. Titanium is a kind of metal having a good oxygen gettering capability. At a temperature of about 500° C., titanium and silicon atoms at the metal/ silicon interface will cross-diffuse to form a titanium silicide layer having a rather low resistivity, thereby forming a good ohmic contact. The method of forming a titanium silicide layer for lowering the resistance and ensuring a good shallow junction between MOS transistor terminal and the metallic connection is known as a self-aligned silicide (Salicide) process.

FIGS. 1a through 1f are cross-sectional views showing the progression of manufacturing steps in the conventional process of forming a barrier layer. First, as shown in FIG. 1a, a semiconductor substrate 100 is provided. The semiconductor substrate 100 has a field oxide layer on each side and a patterned gate terminal 106. In addition, silicon oxide spacers 104 are formed on the sides of the gate terminal 106.

Next, as shown in FIG. 1b, titanium is deposited over the whole wafer using a DC sputtering method, thereby forming a titanium layer 108 above the transistor.

Next, as shown in FIG. 1c, using a high temperature, the titanium film 108 is allow to react with the silicon above the drain and source terminals as well as the polysilicon above the gate terminal of a MOS transistor to form titanium silicide layers 105. This is a self-aligned silicide process, and through this process, the contact resistance is lowered and a good shallow junction between the terminal of a MOS transistor and a metallic layer can be obtained.

Next, as shown in FIG. 1d, a wet etching method is used to remove the unreacted titanium layer 108 and exposing the titanium silicide layers 105 above the three terminals of the MOS transistor.

Next, as shown in FIG. 1e, a dielectric layer 110 deposited over the wafer surface using a chemical vapor deposition method. Then, a pattern is formed on the dielectric layer 110 and then etched to form via channels exposing a portion of the titanium silicide layer 105.

Next, as shown in FIG. 1f, a titanium layer 112 having a desired thickness is deposited over the wafer using a sputtering method, and then a nitridation reaction is carried out to form a titanium nitride layer 114. A nitridation reaction is performed by placing the wafer into a nitrogen-filled or ammonia-filled reaction chamber, and then using rapid thermal processing for nitriding the titanium layer into a titanium nitride layer. Thereafter, a tungsten layer is deposited into the via and surrounding areas followed by a planarizing operation of the tungsten layer. Finally, a tungsten plug 116 is formed. Nevertheless, without rapid thermal processing, the titanium/titanium nitride composite layer has a rather high contact resistance. Hence, a rapid thermal processing operation is added for lowering the contact resistance. However, the rapid thermal processing operation often will lead to the formation of cracks in the titanium nitride layer, and stringers may form when the tungsten is etched back to form the tungsten plug 116. These stringers may lead to the short-circuiting of the transistor and an increase the contact resistance. If a collimator sputtering method is used to form the titanium/titanium nitride composite layer, the formation of cracks in the titanium nitride layer may even be more severe.

On the other hand, if a titanium layer is deposited first followed by a rapid thermal processing operation to form the titanium nitride layer, the titanium nitride reaction will tend to compete with the titanium silicide reaction. Consequently, less titanium silicide will be formed and hence the contact resistance will increase. Besides, compounds of titanium-nitrogen-oxygen formed at the upper layer will also affect the contact resistance.

Therefore, in the past, titanium/titanium nitride thin film is often used as a barrier layer and a glue layer for contact window in the metallization of integrated circuits. The use of rapid thermal processing after the deposition of the titanium/ titanium nitride thin film is capable of lower contact resistance with metal. However, the titanium nitride layer will generate cracks that will result in stringers in the tungsten plug, and leading to short-circuiting of the transistor. The situation will be more serious when collimator-sputtering method is used to form the titanium nitride layer. If a rapid thermal processing operation is performed right after the deposition of titanium layer, and then the titanium nitride layer is subsequently deposited to form the barrier layer, cracks formation in the titanium nitride layer can be greatly reduced. This, however, will lead to a high contact resistance, and is especially serious when a self-aligned silicide process is used on a titanium layer.

In light of the foregoing, there is a need to provide an improved method of forming a barrier layer over MOS transistor terminals.

SUMMARY OF THE INVENTION

Accordingly, the present invention is to provide a process for manufacturing a barrier layer that can avoid the appearance of cracks in the titanium nitride layer, thereby preventing the formation of stringers in tungsten plug that may lead to a short-circuiting of transistor.

In another aspect, the invention provides a process for manufacturing a barrier layer that has a lower contact resistance.

To achieve these and other advantages and in accordance with the purpose of the invention, as embodied and broadly described herein, the invention provides a method for manufacturing a barrier layer over the transistor terminals. The method includes an ion bombardment treatment after the deposition of a titanium nitride layer in order to decrease contact resistance as well as to avoid the production of stringers in the tungsten plugs. The method comprises the steps of providing a substrate having a patterned transistor already formed thereon, and then forming a metallic layer and a metallic nitride layer over the transistor. Next, an ion bombardment treatment is performed, and then a rapid thermal processing operation is carried out in a nitride ions filled gaseous atmosphere. Finally, a tungsten layer is deposited over the metallic nitride layer, and then the tungsten layer is patterned and planarized. Thereafter, subsequent processing operations for completing the device are performed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1a through 1f (Prior Art) are cross-sectional views showing the progression of manufacturing steps in the conventional process of forming a barrier layer.

DESCRIPTION OF THE PREFERRED EMBODIMENTS

Figure 1A:
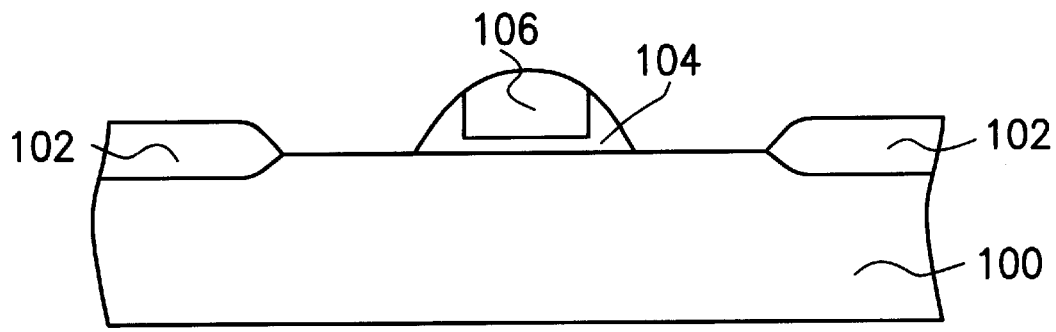
Figure 1B:
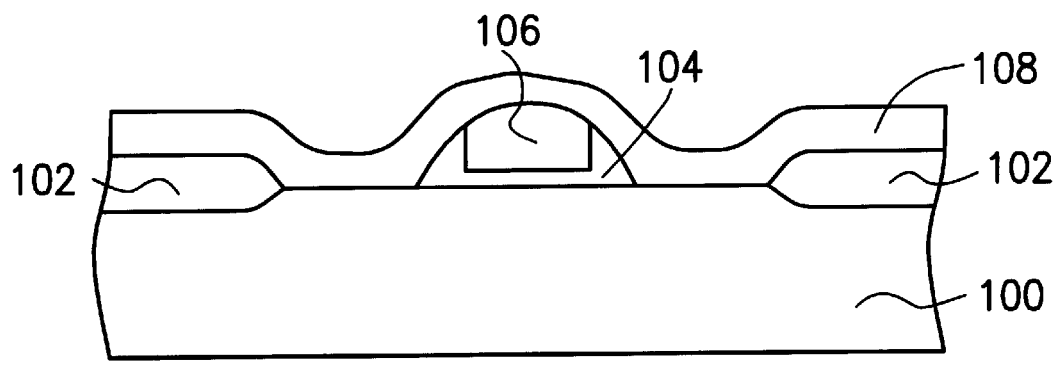
Figure 1C:
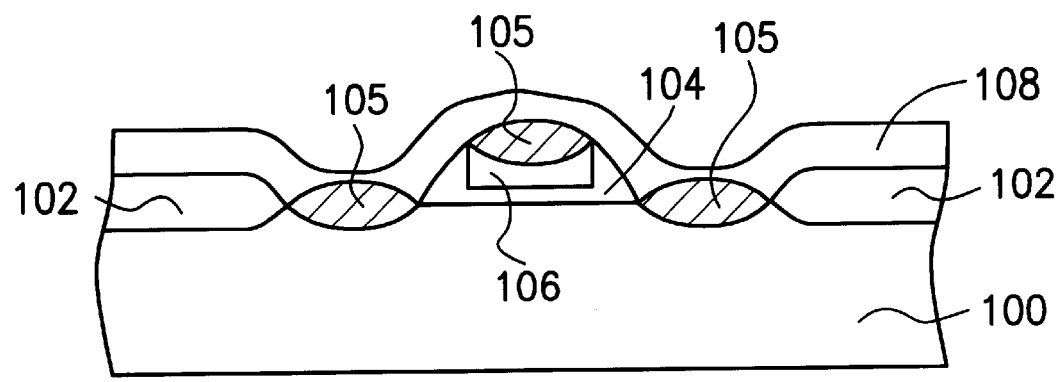
Figure 1D:
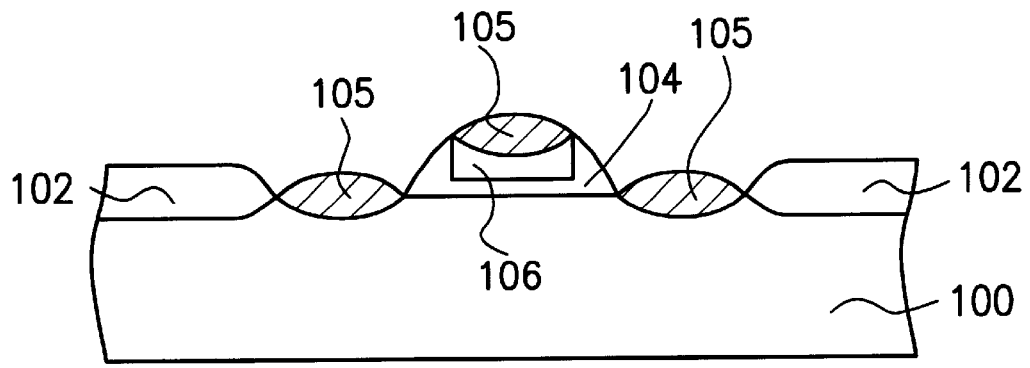
Figure 1E:
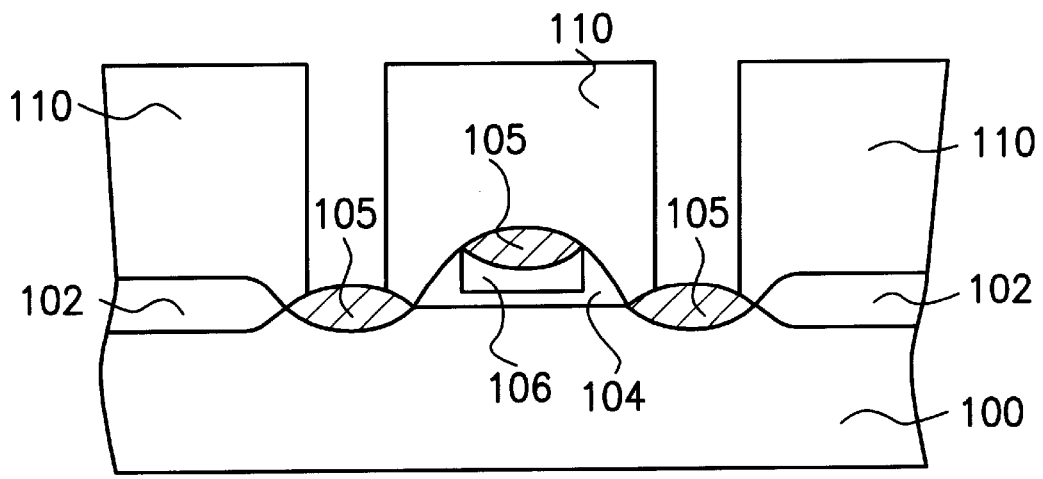
Figure 1F:
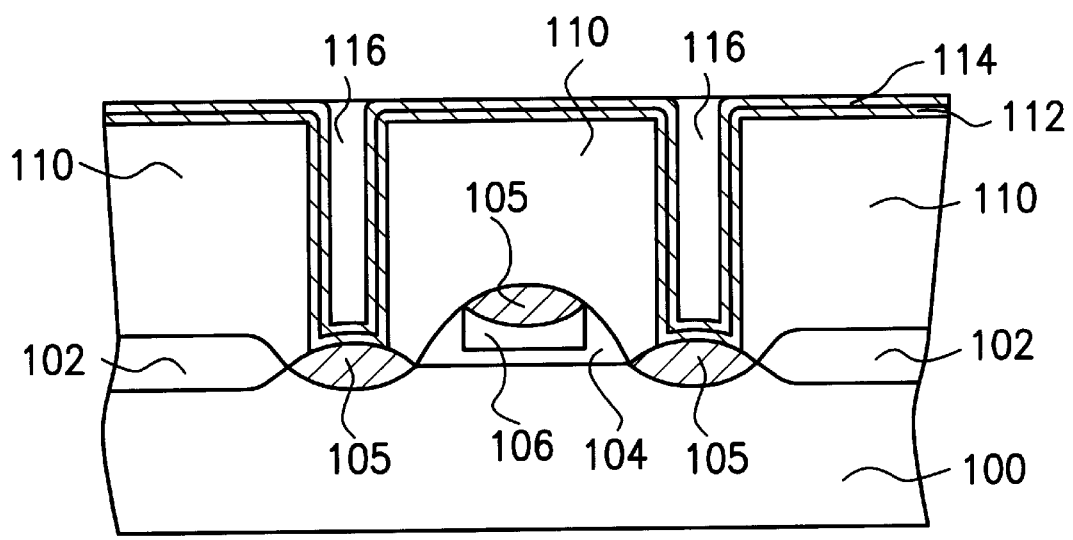

Reference will now be made in detail to the present preferred embodiments of the invention, examples of which are illustrated in the accompanying drawings. Wherever possible, the same reference numbers are used in the drawings and the description to refer to the same or like parts.

Figure 2A:
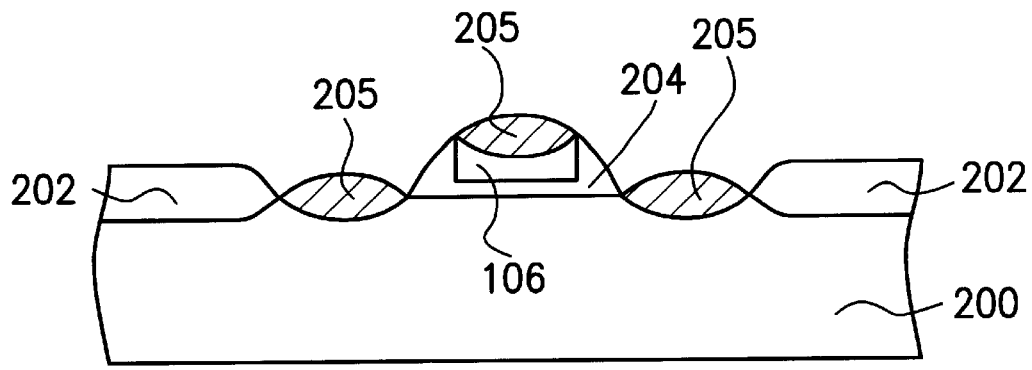
FIGS. 2a through 2c are cross-sectional views showing progression of manufacturing steps in forming a barrier layer according to one preferred embodiment of this invention.
Figure 2B:
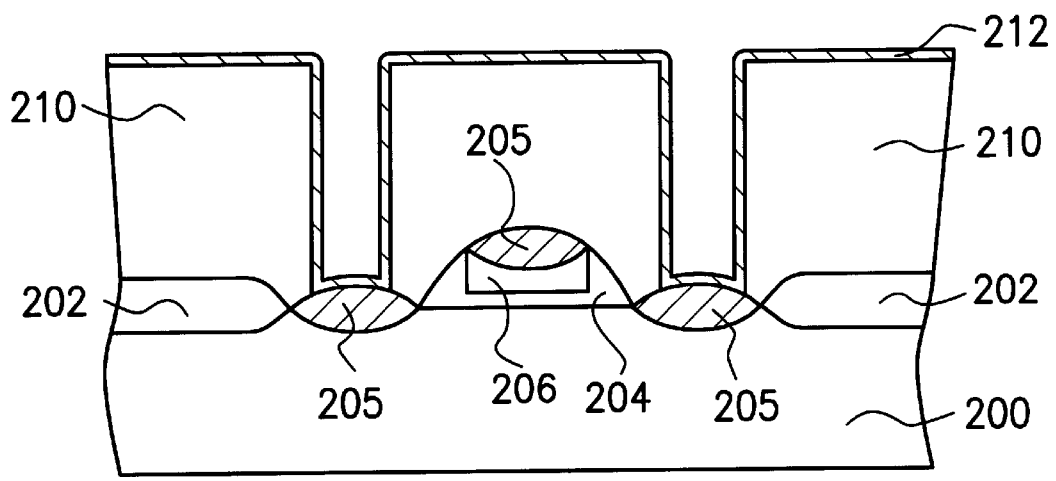
Figure 2C:
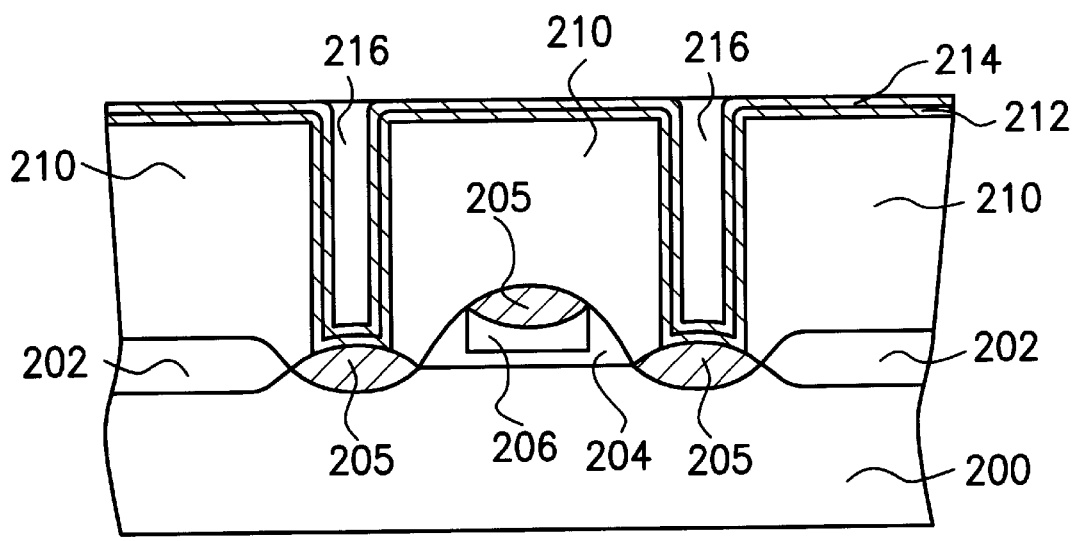

FIGS. 2a through 2c are cross-sectional views showing progression of manufacturing steps in forming a barrier layer according to one preferred embodiment of this invention. First, as shown in FIG. 2a, a semiconductor substrate 200 is provided. The semiconductor substrate 200 has a field oxide layer on each side and a patterned gate terminal 206. In addition, silicon oxide spacers 204 have already formed on the sides of the gate terminal 206. Next a titanium layer is deposited over the wafer. Then, using a high temperature, the titanium layer is allow to react with the silicon above the drain and source terminals as well as the polysilicon above the gate terminal 206 of a MOS transistor to form a titanium silicide layers 205. Subsequently, an etching method is used to remove the unreacted titanium layer.

Next, as shown in FIG. 2b, a dielectric layer 210 is deposited over the wafer surface using a chemical vapor deposition method. Then, the dielectric layer 210 is patterned and then etched to form vias that leads to the titanium silicide layer 205. Thereafter, a reactive sputtering method is used to deposit a titanium/titanium nitride layer. Reactive sputtering deposition employs a titanium-containing metal target, a collimator for ensuring the angle and quality of deposition, and a mixture of gaseous argon and nitrogen. Deposition is achieved through bombarding the metal target with ions thus bringing out the titanium atoms, which then reacts with the dissociated nitrogen atoms and deposits to form a layer of titanium nitride over the wafer surface. Finally, a titanium layer 212 and a titanium nitride layer 214 are formed above the dielectric layer 210.

Next, as shown in FIG. 2c, the transistor undergoes an ion bombardment treatment using, for example, boron or nitrogen ions. Then, a rapid thermal processing operation is performed. Finally, a tungsten layer is deposited over the wafer followed by a planarizing operation to obtain a tungsten plug 210. The tungsten plug 216 formed here does not have stringers, and hence will not cause any short-circuiting of the transistor. Moreover, the contact resistance with metal is lower.

As a summary, the method of forming a barrier layer in this invention has several advantages over the conventional method, including:

(1) The additional ion bombardment treatment after the formation of the titanium nitride layer is capable of reducing the stress within the titanium nitride layer. Hence, no cracks are formed in the titanium nitride layer after subsequent rapid thermal processing operation.

(2) Because the titanium layer is completely covered on top by the titanium nitride layer, there is no competition between a titanium silicide reaction and other types of reactions during rapid thermal processing operation.

(3) The ion bombardment treatment used here follows the normal procedures as in other ion bombardment operations. Hence, one does not have to worry about special equipment or special procedures.

A comparison of the contact resistance of the barrier layer produced by a conventional method and that produced by the method in this invention is shown in Table 1 below. The average value of the contact resistance produced by a conventional method is around 28.94±22.5 Ω/cont, while the average value produced by the preferred embodiment of this invention is around 2.77±0.75 Ω/cont. These figures indicate that this invention can provide a barrier layer having exceptionally low contact resistance, and yet free from short-circuiting problem.

TABLE 1

A comparison between contact resistance of barrier layer produced by a conventional technique versus one produced by the preferred embodiment of this invention

|  | Conventional Technique | Preferred Embodiment of This Invention |
| --- | --- | --- |
| Minimum Value (Ω/cont) | 13.80 | 1.04 |
| Maximum Value (Ω/cont) | 68.40 | 4.62 |
| Average Value (Ω/cont) | 28.94 | 2.77 |
| Standard Deviation (Ω/cont) | 22.50 | 0.75 |

This invention provide a process for forming a barrier layer such that, after the titanium/titanium nitride composite layer deposition is completed, an ion bombardment treatment is carried out, and followed thereafter by a rapid thermal processing operation. Through this processing procedure, contact resistance of the barrier layer is improved and the growth of stringers in subsequently formed tungsten plug, which may lead to short-circuiting of transistor, is prevented. Contact resistance is lowered because titanium in the titanium layer will not react with gaseous ammonia or nitrogen in the reacting chamber to form a high resistance titanium nitride layer during rapid thermal processing operation. No short-circuiting stringers leading from the tungsten plug to the titanium nitride layer below are formed because few cracks are formed in a titanium nitride layer that has been subjected to a stress reducing ion bombardment treatment.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a barrier layer inside a transmitor comprising:

providing a patterned transistor over a substrate;

forming a metallic/metal nitride composite layer over the pattern transistor in a collimator-sputtering deposition process;

performing a bombarding step to target the metal nitride of the metallic/metal nitride composite layer with ions;

performing a rapid thermal processing operation in a nitride ions filled atmosphere; and depositing a tungsten layer over the metal nitride layer, then patterning and planarizing the tungsten layer.

2. The method of claim 1, wherein the step of providing a patterned transistor includes:

providing a transistor on a substrate;

forming a self-aligned silicide layer over the transistor;

forming a dielectric layer over the self-aligned silicide layer; and patterning the dielectric layer to form a via exposing a portion of the self-aligned silicide layer.

3. The method of claim 2, wherein the step of forming the self-aligned silicide layer of self-aligned silicide over the transistor includes:

forming a titanium layer over the transistor;

heating the titanium layer to form a self-aligned silicide layer over the gate and the source/drain terminals of a transistor; and etching to remove the top residual titanium layer.

4. The method of claim 3, wherein the step of forming the titanium layer includes a chemical vapor deposition method.

5. The method of claim 3, wherein the step of forming the self-aligned silicide layer includes depositing a titanium silicide layer.

6. The method of claim 2, wherein the step of forming the dielectric layer includes a chemical vapor deposition method.

7. The method of claim 1, wherein the step of bombarding the metal nitride layer with ions includes boron ions.

8. The method of claim 1, wherein the step of performing rapid thermal processing in a nitride ion filled atmosphere includes a nitride ion filled nitrogen gas.

9. The method of claim 1, wherein the step of performing rapid thermal processing in a nitride ion filled atmosphere includes a nitride ion filled ammonia gas.

10. The method of claim 1, wherein forming the metallic/metal nitride composite layer includes depositing a titanium/titanium nitride layer.

11. A method for forming a transistor barrier layer, wherein a transistor is formed on a substrate having source/drain regions formed in the substrate on a side of the transistor, comprising:

forming a dielectric layer over the substrate, covering the transistor and the source/drain region;

patterning the dielectric layer to form a via opening to expose at least a portion of the source/drain region;

reactive sputtering a titanium/titanium nitride composite layer on the dielectric layer and on a surface of the via opening;

bombarding the titanium nitride of the titanium/titanium nitride composite layer with ions, wherein the ion bombardment targets a surface of the titanium nitride of the titanium/titanium nitride composite layer;

performing a rapid thermal process in a nitride ions filled atmosphere; and depositing a tungsten layer in the via opening.

12. The method of claim 11, wherein the step of reactive sputtering a titanium/titanium nitride composite layer on the dielectric layer and on a surface of the via opening further comprises using a collimator.

13. The method of claim 11, wherein the ions is boron or nitrogen ions.

* * * * *